(12) United States Patent
Kihara et al.

(10) Patent No.: US 9,721,766 B2
(45) Date of Patent: Aug. 1, 2017

(54) METHOD FOR PROCESSING TARGET OBJECT

(71) Applicant: TOKYO ELECTRON LIMITED, Tokyo (JP)

(72) Inventors: Yoshihide Kihara, Miyagi (JP); Toru Hisamatsu, Miyagi (JP); Masanobu Honda, Miyagi (JP); Tomoyuki Oishi, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/284,635

(22) Filed: Oct. 4, 2016

(65) Prior Publication Data

US 2017/0098528 A1 Apr. 6, 2017

(30) Foreign Application Priority Data

Oct. 6, 2015 (JP) .................................. 2015-198649
May 20, 2016 (JP) .................................. 2016-101357

(51) Int. Cl.
*H01L 21/311* (2006.01)
*H01J 37/32* (2006.01)
*H01L 21/027* (2006.01)

(52) U.S. Cl.
CPC .. *H01J 37/32871* (2013.01); *H01J 37/32009* (2013.01); *H01L 21/0276* (2013.01); *H01L 21/31116* (2013.01); *H01L 21/31138* (2013.01); *H01L 21/31144* (2013.01); *H01J 2237/334* (2013.01)

(58) Field of Classification Search
USPC ........................................................ 438/695
See application file for complete search history.

(56) References Cited

U.S. PATENT DOCUMENTS 7,399,388 B2 * 7/2008 Moghadam ........... C23C 16/402
204/192.3
2004/0029052 A1 2/2004 Park et al.

FOREIGN PATENT DOCUMENTS

JP 2004-80033 A 3/2004

* cited by examiner

*Primary Examiner* — Roberts Culbert
(74) *Attorney, Agent, or Firm* — Rothwell, Figg, Ernst & Manbeck, P.C.

(57) ABSTRACT

A method for processing a target object includes a formation step of forming a silicon oxide film in a processing chamber by repeatedly executing a sequence including a first step of supplying a first gas containing aminosilane-based gas, a second step of purging a space in the processing chamber after the first step, a third step of generating a plasma of a second gas containing oxygen gas after the second step, and a fourth step of purging the space after the third step. The method further includes a preparation step executed before the target object is accommodated in the processing chamber and a processing step of performing an etching process on the target object. The preparation step is performed before the processing step. The formation step is performed in the preparation step and the processing step. In the first step, a plasma of the first gas is not generated.

11 Claims, 12 Drawing Sheets

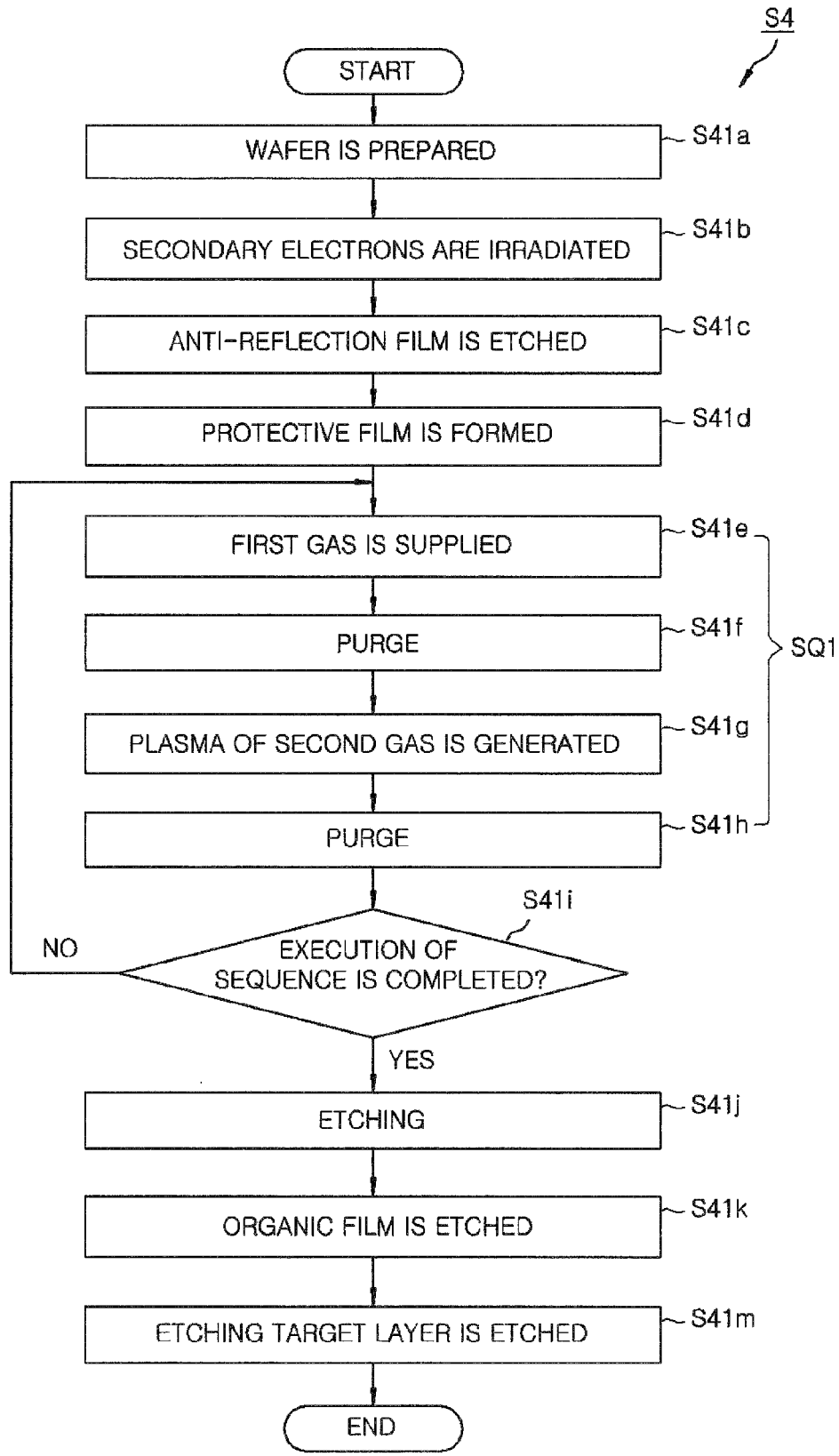

METHOD FOR PROCESSING TARGET OBJECT

CROSS-REFERENCE TO RELATED APPLICATIONS

This application claims priority to Japanese Patent Application Nos. 2015-198649 and 2016-101357 respectively filed on Oct. 6, 2015 and May 20, 2016, the entire contents of which are incorporated herein by reference.

FIELD OF THE INVENTION

The disclosure relates to a method for processing a target object; and more particularly, to a method for processing a surface of a semiconductor substrate by using a plasma.

BACKGROUND OF THE INVENTION

In a manufacturing process of electronic devices such as semiconductor devices, plasma processing may be performed on a target object to be processed by using a plasma processing apparatus. The plasma process includes plasma etching. The plasma etching is performed to transfer a pattern of a mask formed on an etching target layer to the etching target layer. As for the mask, a resist mask is generally used. The resist mask is formed by a photolithography technology. Therefore, a limit of dimension of the pattern formed on the etching target layer depends on resolution of the resist mask formed by the photolithography technology. However, the resolution of the resist mask has a resolution limit. Since the demand for high integration of the electronic devices is increasing and the formation of a pattern having a dimension smaller than the resolution limit of the resist mask is required, there is suggested in Japanese Patent Application Publication No. 2004-80033 a technique for adjusting a dimension of a resist mask by forming a silicon oxide film on the resist mask and reducing a width of an opening provided by the resist mask.

Due to the recent trend toward miniaturization accompanying the high integration of the electronic devices, it is required to control a critical dimension (CD) with high accuracy in forming a pattern on the target object. Further, a long-term stable reproducibility of the critical dimension or the like is required in view of a production yield of the electronic devices.

In the plasma processing, the critical dimension generally varies due to changes in the plasma state caused by changes in surface states of constituent components (e.g., an inner wall surface of a processing chamber where the plasma is generated, inner wall surfaces of various lines connected to the processing chamber, and the like) of the plasma processing apparatus, which are exposed to a processing space where a plasma is generated. The surface states of the constituent components of the plasma processing apparatus which are exposed to the processing space are changed by consumption of the surfaces of the corresponding components due to long-term use of the plasma. The consumption of the surfaces of the corresponding components leads to changes in surface temperatures of the corresponding components. The changes in the surface temperatures result in changes in a deposition rate of radicals.

Further, in the plasma processing, particles that may cause product defects may be generated. The particles may be generated from the surfaces of the constituent components of the plasma processing apparatus which are exposed to the processing space. The adhesion of the particles on a wafer leads to product failure. If the particles are adhered onto the pattern, the transfer of the pattern is disturbed and, further, the realization of the critical dimension with high accuracy and the stable reproduction of the critical dimension may be disturbed.

SUMMARY OF THE INVENTION

In view of the above, the disclosure provides a method for controlling a critical dimension with high accuracy and realizing stable reproduction of the critical dimension to achieve miniaturization accompanying a high integration in forming a pattern on a target object.

In accordance with an embodiment of the disclosure, there is provided a method for processing a target object, including: a formation step of forming a silicon oxide film in a processing chamber of a plasma processing apparatus by repeatedly executing a sequence including a first step of supplying a first gas containing aminosilane-based gas into the processing chamber, a second step of purging a space in the processing chamber after the execution of the first step, a third step of generating a plasma of a second gas containing oxygen gas in the processing chamber after the execution of the second step, and a fourth step of purging the space in the processing chamber after the execution of the third step; a preparation step which is executed before the target object is accommodated in the processing chamber; and a processing step of performing an etching process on the target object accommodated in the processing chamber. The preparation step is performed before the processing step. The formation step is performed in the preparation step and the processing step. In the first step, a plasma of the first gas is not generated.

BRIEF DESCRIPTION OF THE DRAWINGS

The objects and features of the disclosure will become apparent from the following description of embodiments, given in conjunction with the accompanying drawings, in which:

FIG. 4 is a flowchart showing an example of a wafer processing step shown in FIG. 1;

DETAILED DESCRIPTION OF THE EMBODIMENTS

Figure 1:
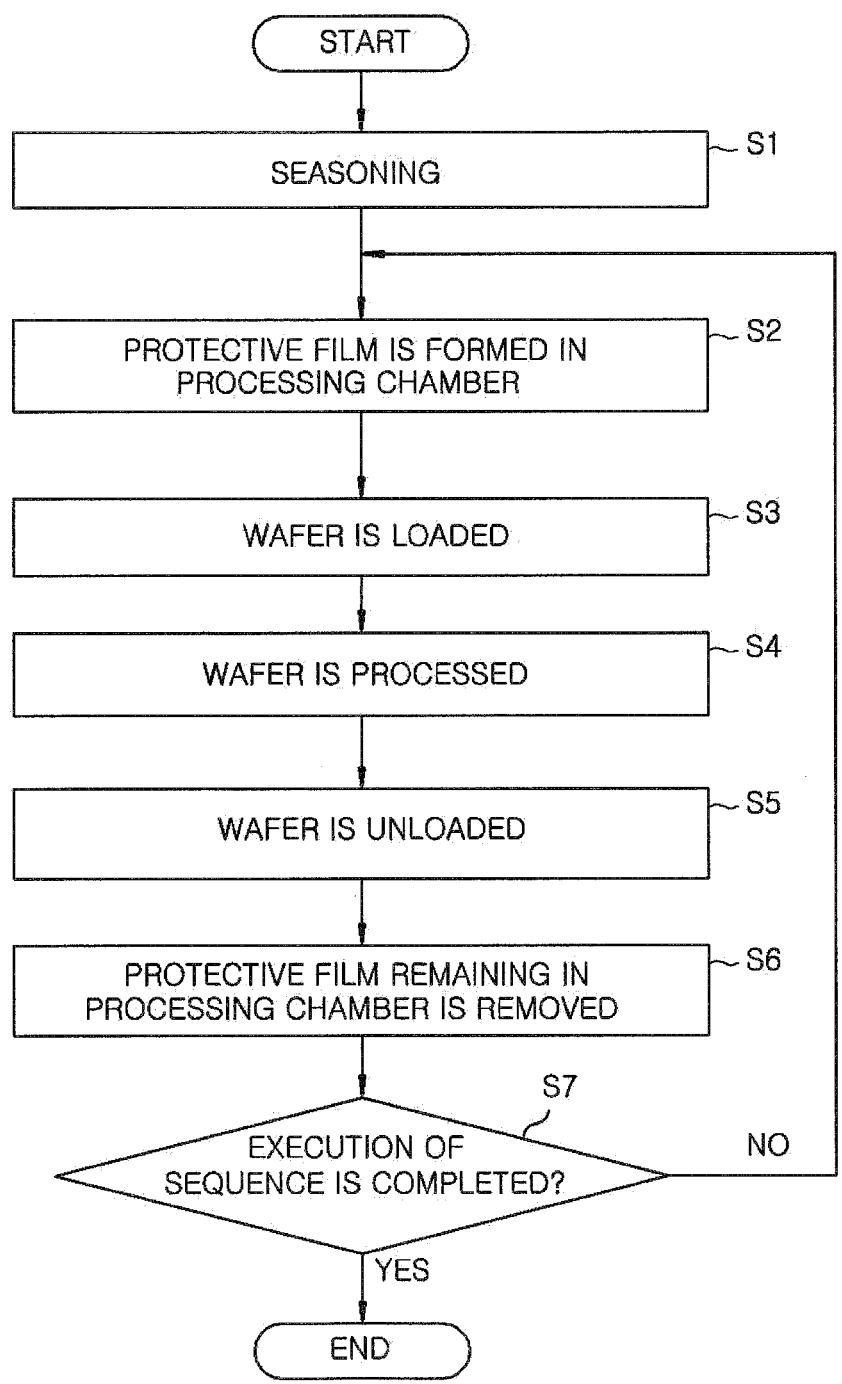
FIG. 1 is a flowchart of a method according to an embodiment.

Hereinafter, embodiments will be described in detail with reference to the accompanying drawings. Like reference numerals will be given to like or corresponding parts throughout the drawings.

FIG. 1 is a flowchart of a method according to an embodiment. A method MT according to the embodiment shown in FIG. 1 is a method for processing a target object to be processed (hereinafter, it may be also referred to as "wafer"). In the method MT, a series of steps can be performed by using a single plasma processing apparatus.

Figure 2:
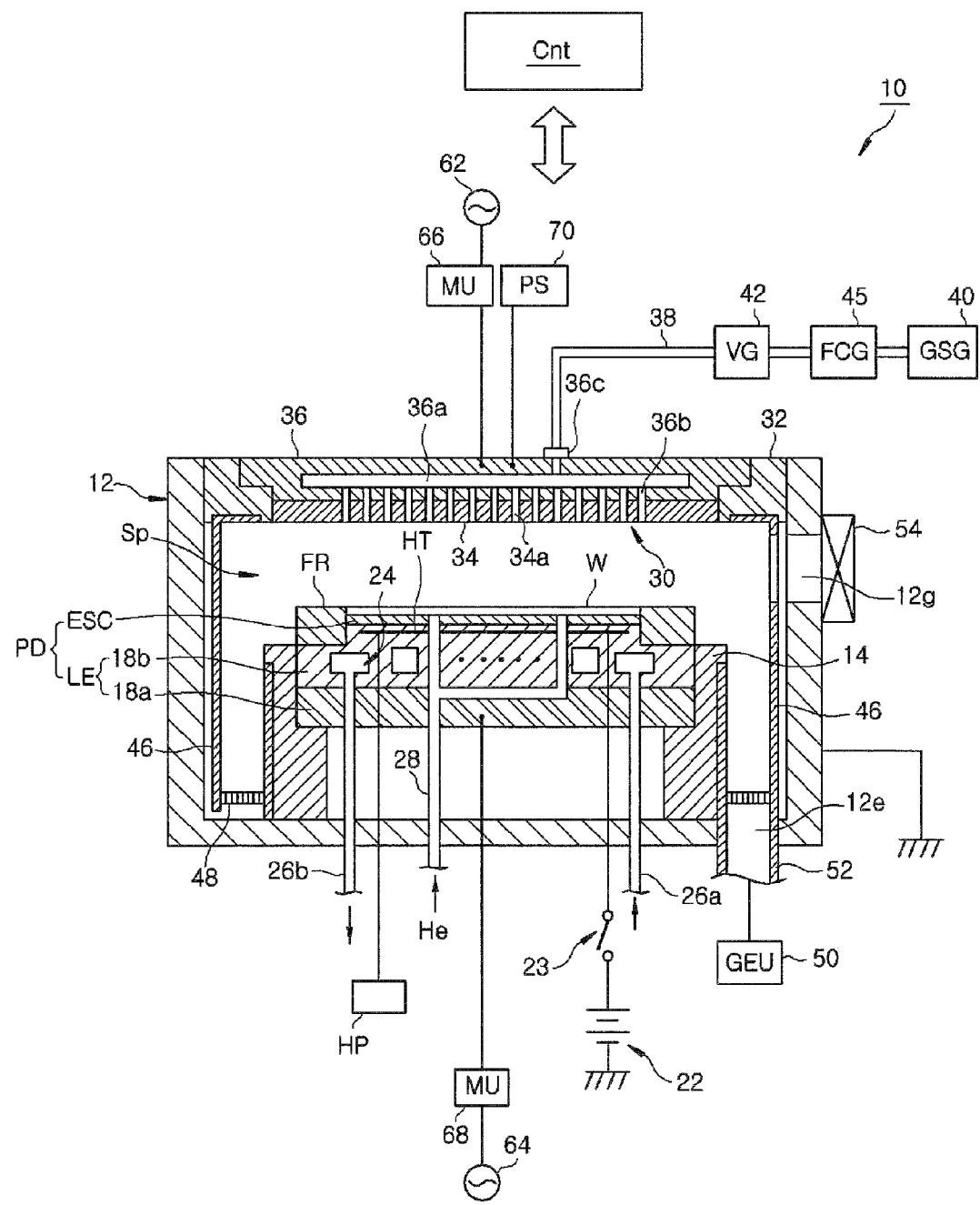
FIG. 2 shows an example of a plasma processing apparatus.

FIG. 2 shows an example of a plasma processing apparatus. In FIG. 2, a cross sectional structure of a plasma processing apparatus 10 that can be used in various embodiments of the method for processing a target object is schematically illustrated. As shown in FIG. 2, the plasma processing apparatus 10 is a capacitively coupled plasma etching apparatus.

The plasma processing apparatus 10 includes a processing chamber 12, a gas exhaust port 12e, a loading/unloading port 12g, a supporting part 14, a mounting table PD, a DC power supply 22, a switch 23, a coolant path 24, lines 26a and 26b, a heat transfer gas supply line 28, an upper electrode 30, an insulating shield member 32, an electrode plate 34, gas injection holes 34a, an electrode holder 36, a gas diffusion space 36a, gas holes 36b, a gas inlet port 36c, a gas supply line 38, a gas source group (GSG) 40, a valve group (VG) 42, a flow rate controller group (FCG) 45, a deposition shield 46, a gas exhaust plate 48, a gas exhaust unit (GEU) 50, a gas exhaust line 52, a gate valve 54, a first high frequency power supply 62, a second high frequency power supply 64, matching units (MU) 66 and 68, a power supply (PS) 70, a control unit Cnt, a focus ring FR, a heater power supply HP, and a heater HT. The mounting table PD has an electrostatic chuck ESC and a lower electrode LE. The lower electrode LE has a first plate 18a and a second plate 18b. The processing chamber 12 defines a processing space Sp.

The processing chamber 12 has a substantially cylindrical shape. The processing chamber 12 is made of, e.g., aluminum. An inner wall surface of the processing chamber 12 is anodically oxidized. The processing chamber 12 is frame grounded.

The supporting part 14 is disposed on a bottom portion in the processing chamber 12. The supporting part 14 has a substantially cylindrical shape. The supporting part 14 is made of, e.g., an insulating material. The insulating material forming the supporting part 14 may be a material such as quartz containing oxygen. The supporting part 14 extends vertically from the bottom portion in the processing chamber 12.

The mounting table PD is provided inside the processing chamber 12. The mounting table PD is supported by the supporting part 14. On a top surface of the mounting table PD, the wafer W (e.g., a wafer W1 shown in FIGS. 5A to 5D, a wafer W2 shown in FIGS. 10A and 10B, or the like, the same is true in the following description) is supported. The wafer W is the target object to be processed. The mounting table PD has the lower electrode LE and the electrostatic chuck ESC.

The lower electrode LE has the first plate 18a and the second plate 18b. The first plate 18a and the second plate 18b are made of a metal, e.g., aluminum. The first plate 18a and the second plate 18b have a substantially disc shape. The second plate 18b is disposed on the first plate 18a. The second plate 18b is electrically connected to the first plate 18a.

The electrostatic chuck ESC is disposed on the second plate 18b. The electrostatic chuck ESC has a structure in which an electrode made of a conductive film is embedded between two insulating layers or two insulating sheets. The DC power supply 22 is electrically connected to the electrode of the electrostatic chuck ESC through the switch 23. The wafer W can be attracted and held on the electrostatic chuck ESC by an electrostatic force such as a Coulomb force generated by a DC voltage applied from the DC power supply 22.

The focus ring FR is disposed on a peripheral portion of the second plate 18b to surround the edges of the wafer W and the electrostatic chuck ESC. The focus ring FR is provided to improve the uniformity of the etching. The focus ring FR is made of a material that is appropriately selected depending on a material of an etching target film. For example, the focus ring FR may be made of quartz.

A coolant path 24 is provided in the second plate 18b. The coolant path 24 constitutes a temperature control unit. A coolant is supplied to the coolant path 24 from a chiller unit (not shown) provided outside of the processing chamber 12 through the line 26a. The coolant flowing in the coolant path 24 returns to the chiller unit through the line 26b. In this manner, the coolant is supplied into and circulates through the coolant path 24. A temperature of the wafer W held by the electrostatic chuck ESC is controlled by controlling a temperature of the coolant. A heat transfer gas, e.g., He gas, from a heat transfer gas supply unit (not shown) is supplied through the heat transfer gas supply line 28 to a gap between a top surface of the electrostatic chuck ESC and a backside of the wafer W.

The heater HT is a heating element. The heater HT is buried in, e.g., the second plate 18b. The heater power supply HP is connected to the heater HT. By supplying power from the heater power supply HP to the heater HT, the temperature of the mounting table PD is controlled and, further, the temperature of the wafer W mounted on the mounting table PD is controlled. The heater HT may be embedded in the electrostatic chuck ESC.

The upper electrode 30 is provided above the mounting table 18 to face the mounting table 18. The upper electrode 30 and the lower electrode LE are approximately parallel to each other. Between the upper electrode 30 and the lower electrode LE, the processing space Sp where plasma processing is performed on the wafer W is defined.

The upper electrode 30 is held at an upper portion of the processing chamber 12 through the insulating shield member 32. The insulating shield member 32 is made of an insulating material, e.g., quartz containing oxygen. The upper electrode 30 may include the electrode plate 34 and the electrode holder 36. The electrode plate 34 is in contact with the processing space Sp and has the gas injection holes 34a. In one embodiment, the electrode plate 34 may be made of silicon. In another embodiment, the electrode plate 34 may be made of silicon oxide.

The electrode holder 36 detachably holds the electrode plate 34 and is made of a conductive material, e.g., aluminum. The electrode holder 36 may have a water cooling structure. The gas diffusion space 36a is provided in the electrode holder 36. A plurality of gas holes 36b communicating with the gas injection holes 34a extends downward (toward the mounting table PD) from the gas diffusion space 36a.

The gas inlet port 36c guides a processing gas into the gas diffusion space 36a. The gas inlet port 36c is provided at the electrode holder 36. The gas supply line 38 is connected to the gas inlet port 36c.

The gas source group 40 is connected to the gas supply line 38 through the valve group 42 and the flow rate controller group 45. The gas source group 40 has a plurality of gas sources including an aminosilane-based gas source, a halogenated silicon gas source, an oxygen gas source, a hydrogen gas source, a nitrogen gas source, a fluorocarbon gas source, and a rare gas source. As for the aminosilane-based gas, a gas having a molecular structure with the relatively small number of amino groups, e.g., monoaminosilane ($H_3$—Si—R (R being an amino group that contains an organic and may be substituted)), may be used. The aminosilane-based gas (gas contained in a first gas G1 to be described later) may contain aminosilane having one to three silicon atoms or may contain aminosilane having one to three amino groups. Aminosilane having one to three silicon atoms may be monosilane (monoaminosilane) having one to three amino groups, disilane having one to three amino groups, or trisilane having one to three amino groups.

Aminosilane may have an amino group that may be substituted. The amino group may be substituted by any one of a methyl group, an ethyl group, a propyl group and a butyl group. The methyl group, the ethyl group, the propyl group and the butyl group may be substituted by halogen. As for the halogenated silicon gas, DCS (dichlorosilane) gas may be used. As for the fluorocarbon gas, any fluorocarbon gas such as $CF_4$ gas, $C_4F_6$ gas, $C_4F_8$ gas may be used. As for the rare gas, any rare as such as He gas, or Ar gas may be used.

The valve group 42 includes a plurality of valves. The flow rate controller group 45 includes a plurality of flow rate controllers such as mass flow controllers. The gas sources of the gas source group 40 are connected to the gas supply line 38 via corresponding valves of the valve group 42 and corresponding flow rate controllers of the flow rate controller group 45. Therefore, the plasma processing apparatus 10 can supply gases from one or more gas sources selected among the gas sources of the gas source group 40 to the processing chamber 12 at individually controlled flow rates. Further, in the plasma processing apparatus 10, the deposition shield 46 is detachably provided along an inner wall of the processing chamber 12. The deposition shield 46 is also provided at an outer periphery of the supporting part 14. The deposition shield 46 prevents an etching by-product (deposit) from being adhered to the processing chamber 12. The deposition shield 46 may be made of aluminum coated with ceramic such as $Y_2O_3$ or the like. The deposition shield 46 may be made of a material containing oxygen, e.g., quartz, other than $Y_2O_3$.

At the lower side in the processing chamber 12, the gas exhaust plate 48 is provided between the supporting part 14 and the sidewall of the processing chamber 12. The gas exhaust plate 48 may be formed by coating aluminum with ceramic, e.g., $Y_2O_3$ or the like. The gas exhaust port 12e is provided below the gas exhaust plate 48. The gas exhaust unit 50 is connected to the gas exhaust port 12e through the gas exhaust line 52. The gas exhaust unit 50 has a vacuum pump such as a turbo molecular pump or the like, so that the space in the processing chamber 12 can be depressurized to a desired vacuum level. The loading/unloading port 12g for the wafer W is provided at the sidewall of the processing chamber 12. The loading/unloading port 12g can be opened and closed by the gate valve 54.

The high frequency power supply 62 generates a first high frequency power for plasma generation. The first high frequency power has a frequency in a range from 27 MHz to 100 MHz, e.g., 40 MHz. The first high frequency power supply 62 is connected to the upper electrode 30 via the matching unit 66. The matching unit 66 is a circuit for matching an output impedance of the first high frequency power supply 62 and an input impedance of a load side (the lower electrode LE side). The first high frequency power supply 62 may be connected to the lower electrode LE via the matching unit 66.

The second frequency power supply 64 generates a second high frequency power for attracting ions to the wafer W, i.e., a high frequency bias power. The second high frequency power has a frequency in a range from 400 kHz to 40.68 MHz, e.g., 3.2 MHz. The second high frequency power supply 64 is connected to the lower electrode LE via the matching unit 68. The matching unit 68 is a circuit for matching an output impedance of the second high frequency power supply 64 and the input impedance of the load side (the lower electrode LE side). The power supply 70 is connected to the upper electrode 30. The power supply 70 applies a voltage for attracting positive ions in the processing space Sp toward the electrode plate 34 to the upper electrode 30. In this example, the power supply 70 is a DC power supply for generating a negative DC voltage. When the voltage is applied from the power supply 70 to the upper electrode 30, positive ions in the processing space Sp collide with the electrode plate 34. Accordingly, secondary electrons and/or silicon are sputtered from the electrode plate 34.

The control unit Cnt is a computer including a processor, a storage unit, an input device, a display device and the like. The control unit Cnt controls the respective components of the plasma processing apparatus 10. Specifically, the control unit Cnt is connected to the valve group 42, the flow rate control group 45, the gas exhaust unit 50, the first high frequency power supply 62, the matching unit 66, the second high frequency power supply 64, the matching unit 68, the power supply 70, the heater power supply HP and the chiller unit.

The control unit Cnt operates in accordance with a program based on an input recipe and sends control signals. The selection and the flow rate of the gases supplied from the gas source group, the exhaust of the gas exhaust unit 50, the power supply from the first high frequency power supply 62 and the second high frequency power supply 64, the voltage application from the power supply 70, the power supply from the heater power supply HP, the flow rate and the temperature of the coolant supplied from the chiller unit can be controlled by the control signals sent from the control unit Cnt. The respective steps of the method for processing the target object which are disclosed in this specification can be executed by operating the respective components of the plasma processing apparatus 10 under the control of the control unit Cnt.

Figure 3:
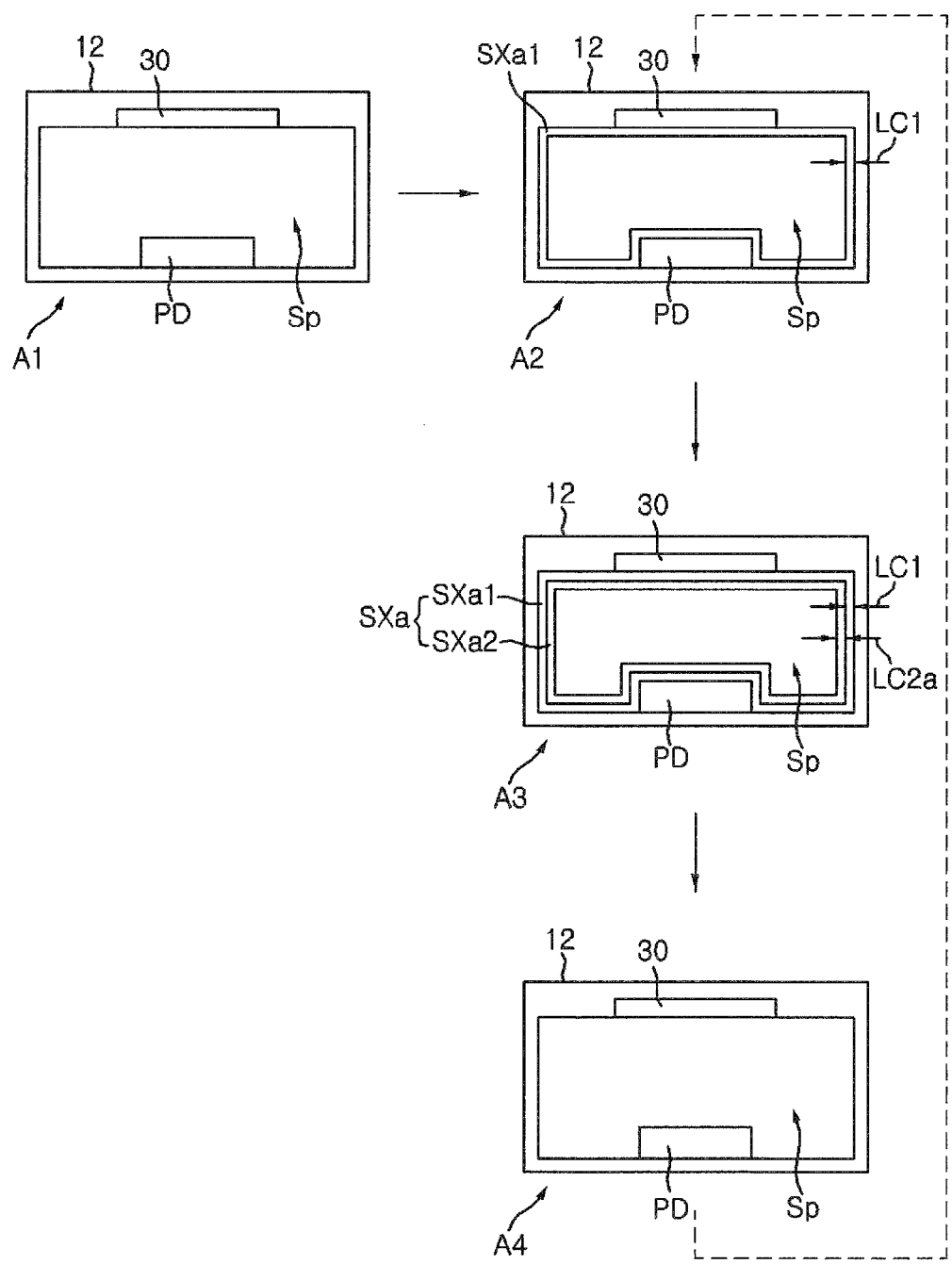
FIG. 3 shows formation of a protective film inside a processing chamber.
Figure 9:
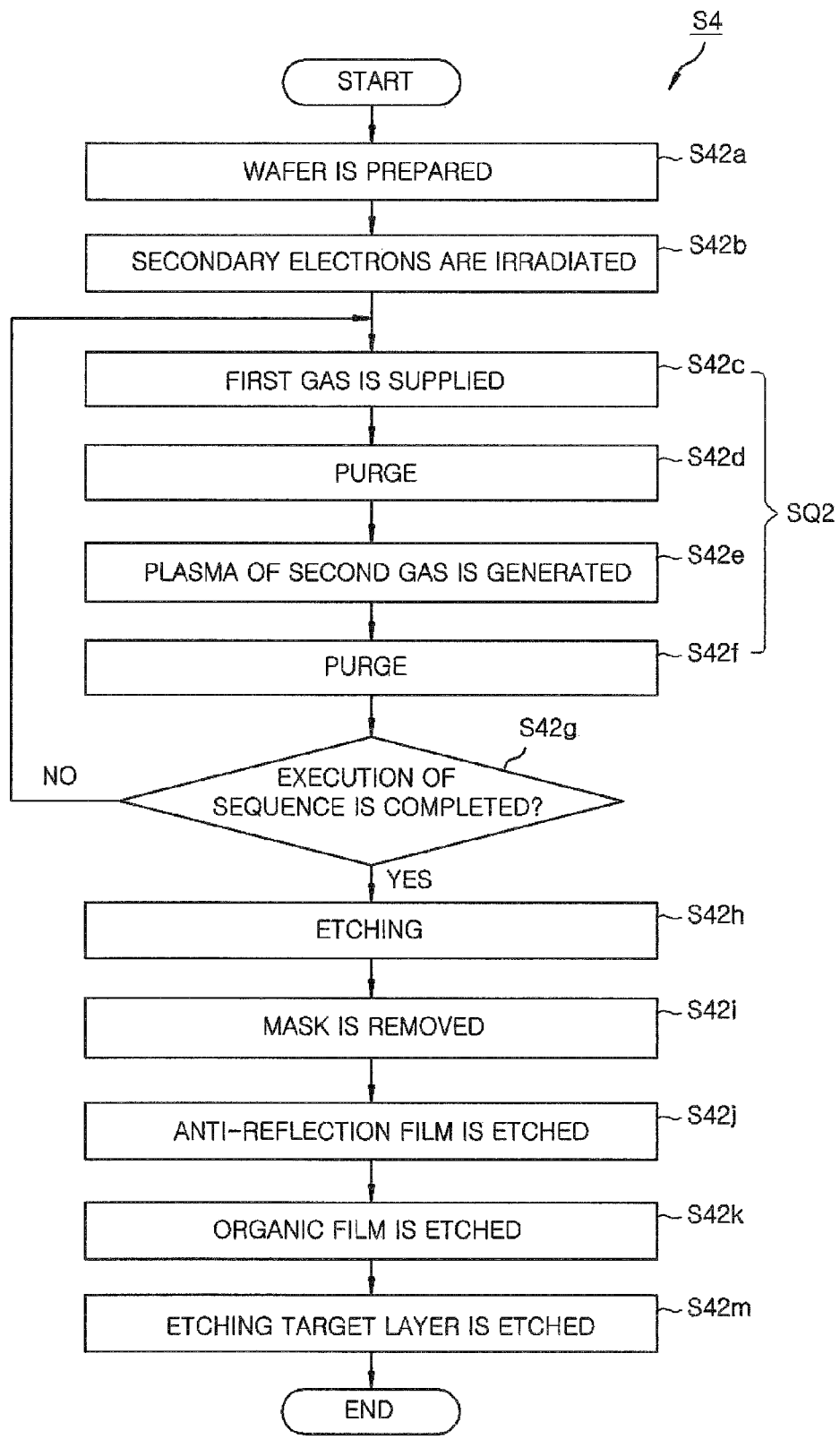
FIG. 9 is a flowchart showing another example of the wafer processing step shown in FIG. 1.
Figure 10A:
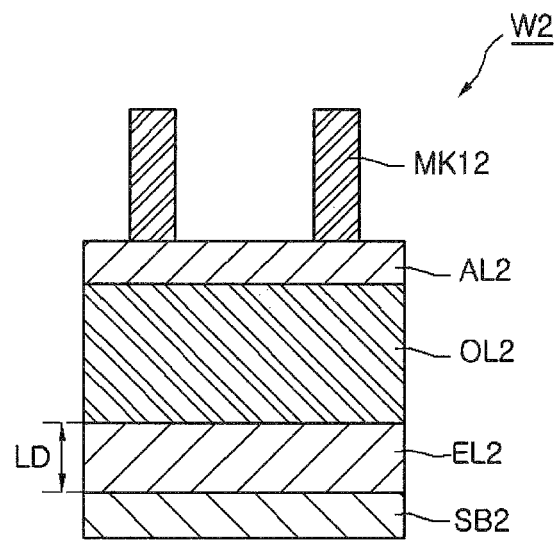
FIGS. 10A and 10B are cross sectional views showing states of a target object before and after execution of corresponding steps shown in FIG. 9.
Figure 10B:
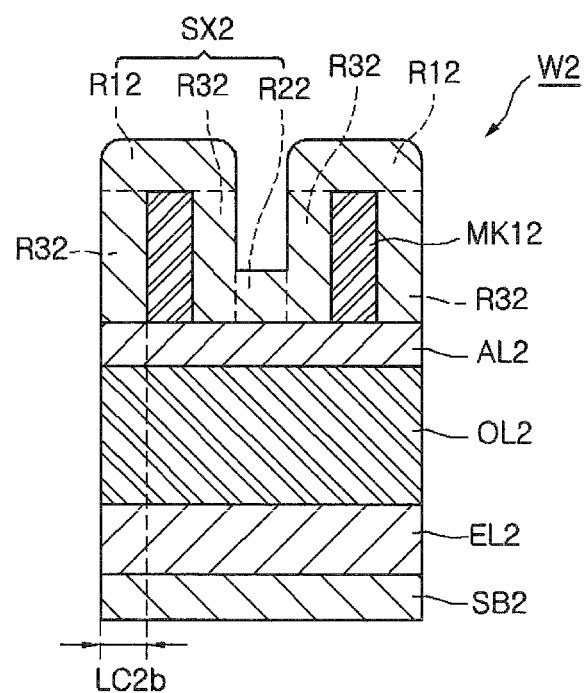

Referring back to FIG. 1, the method MT will be described in detail. Hereinafter, there will be described an example in which the plasma processing apparatus 10 is used for implementing the method MT with reference to FIGS. 3, 4, 5, 9 and 10. FIG. 3 shows formation of a protective film inside the processing chamber 12. FIG. 4 is a flowchart showing an example of a wafer processing step shown in FIG. 1. FIGS. 5A to 5D are cross sectional views showing states of the target object before and after execution of corresponding steps shown in FIG. 4. FIG. 9 is a flowchart showing another example of the wafer processing step shown in FIG. 1. FIGS. 10A and 10B are cross sectional views showing states of the target object before and after execution of corresponding steps shown in FIG. 9.

First, in a step S1 of the method MT shown in FIG. 1, a dummy wafer is mounted on the mounting table PD in the processing chamber 12 and a seasoning process is performed in the processing chamber 12. After the seasoning process is completed, the dummy wafer is unloaded from the processing chamber 12. In the step S1, as shown in a state A1 of FIG. 3, the surfaces (e.g., an inner wall surface of the processing chamber 12 where the plasma is generated, inner wall surfaces of various lines such as the gas supply line 38 and the like which are connected to the processing chamber 12, and the like, the same is true in the following description) of the respective constituent components of the plasma processing apparatus 10 inside the processing chamber 12 are exposed to the processing space Sp. The various lines such as the gas supply line 38 and the like which are connected to the processing chamber 12 communicate with the processing space Sp and thus are exposed to the processing space Sp.

Next, in a step S2 (preparation step), before the wafer W as the target object is loaded into the processing chamber 12, a protective film SXa1 that is a silicon oxide film ($SiO_2$) is formed on the surfaces of the respective constituent components of the plasma processing apparatus 10 which are exposed to the processing space Sp. The process of forming the protective film SXa1 in the step S2 can be performed by the same sequence as a sequence SQ1 shown in FIG. 4 or a sequence SQ2 shown in FIG. 9. The sequence SQ1 or SQ2 is included in the process of forming a protective film SX1 shown in FIG. 5A to 5D or the process of forming a protective film SX2 shown in FIGS. 10A and 10B, each of which is the silicon oxide film ($SiO_2$), and the process is carried out in the following step S4 (processing step). Further, the following description of the sequences SQ1 and SQ2 to be described later will also explain the process of forming the protective film SXa1 in the step S2. As shown in a state A2 of FIG. 3, by the process of forming the protective film SXa1 in the step S2, the protective film SXa1 can be conformally formed with a uniform thickness LC1 on the surfaces of the constituent components of the plasma processing apparatus 10 which are exposed to the processing space Sp regardless of the shapes of the surfaces.

Next, in a step S3, the wafer W as the target object (the wafer W1 shown in FIG. 5A or the wafer W2 shown in FIG. 10A) is loaded into the processing chamber 12 and mounted on the mounting table PD in the processing chamber 12.

Next, in the step S4 (processing step), an etching process is performed on the wafer W accommodated in the processing chamber 12. An example of the specific process in the step S4 is shown in FIG. 4 and will be described later. Another example of the specific process in the step S4 is shown in FIG. 9 and will be described later. When the protective film SX1 is formed on the wafer W1 (see FIGS. 5A to 5D) in the sequence SQ1 (see FIG. 4) included in the step S4 or the protective film SX2 is formed on the wafer W2 (see FIGS. 10A and 10B) in the sequence SQ2 (see FIG. 9) included in the step S4, a protective film SXa2 that is the silicon oxide film ($SiO_2$) can also be conformally formed with a uniform thickness LC2a on the entire surface of the protective film SXa1 regardless of the shape of the surface of the protective film SXa1, as shown in a state A3 of FIG. 3. The protective films SXa1 and SXa2 are silicon oxide films made of the same material and having the same structure. The protective films SXa1 and SXa2 form a single protective film SXa. The protective film SXa has a uniform thickness (LC1+LC2a). Therefore, the protective film SXa can be formed conformally with the uniform thickness LC1+LC2a on the surfaces of the respective constituent components of the plasma processing apparatus 10 which are exposed to the processing space Sp regardless of the shapes of the surfaces.

Next, in a step S5, the wafer W is unloaded from the processing chamber 12. Next, in a step S6, the protective film SXa remaining inside the processing chamber 12 and inside the various lines such as the gas supply line 38 and the like which are connected to the processing chamber 12 is removed. Accordingly, as shown in a state A4 of FIG. 3, the surfaces of the respective constituent components of the plasma processing apparatus 10 are exposed to the processing space Sp. If the protective film SXa is completely removed in the etching process in the step S4, it is unnecessary to execute the step S6.

Next, in a step S7, when there is another wafer to be subjected to a sequence of the steps S2 to S6 (step S7: NO), the processing proceeds to the step S2. When there is no wafer to be subjected to the sequence of the steps S2 to S6 (step S7: YES), the execution of the method MT is completed.

Figure 5A:
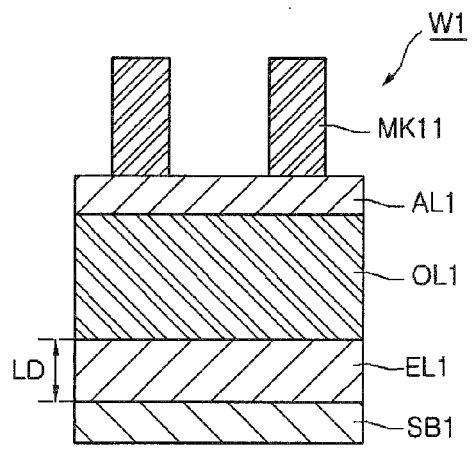
FIGS. 5A to 5D are cross sectional views showing states of a target object before and after execution of corresponding steps shown in FIG. 4.
Figure 5B:
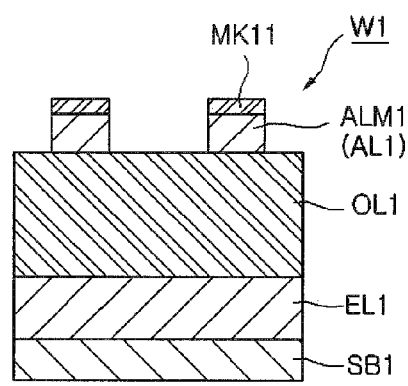
Figure 6A:
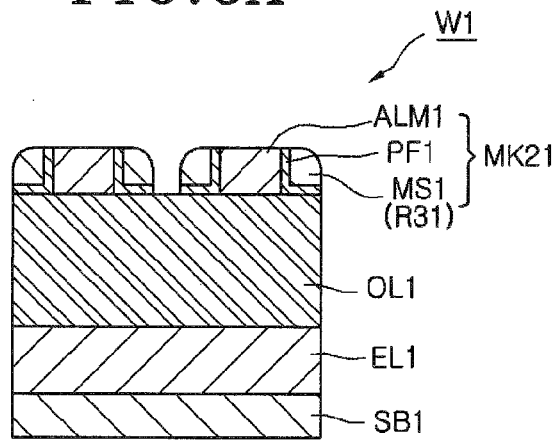
FIGS. 6A to 6C are cross sectional views showing the states of the target object after the execution of corresponding steps shown in FIG. 4.
Figure 6B:
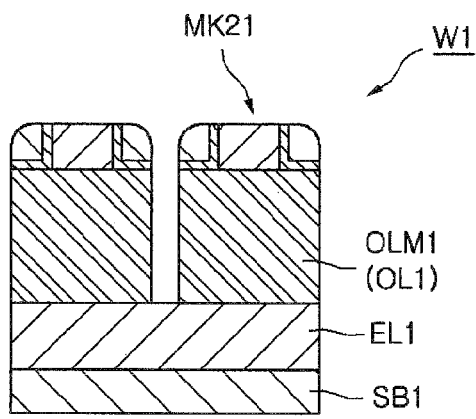
Figure 6C:
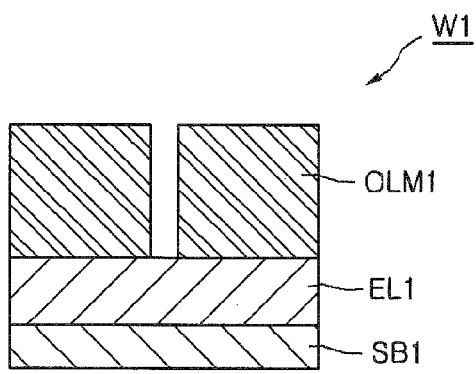
Figure 7A:
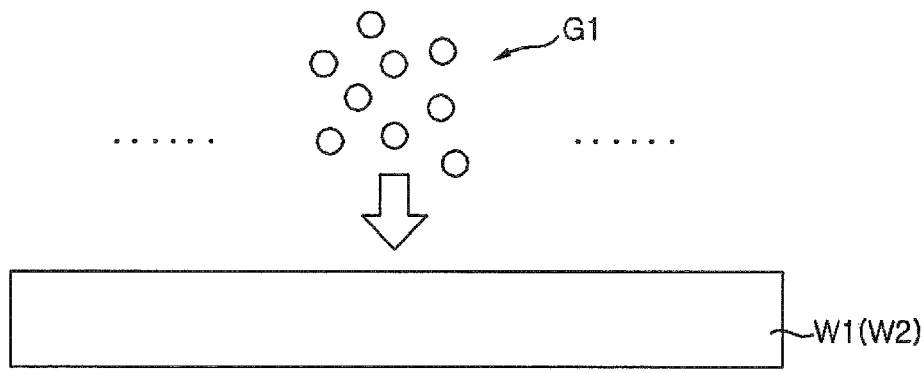
FIGS. 7A to 7C schematically show formation of a protective film in a protective film forming sequence shown in FIG. 4.
Figure 7B:
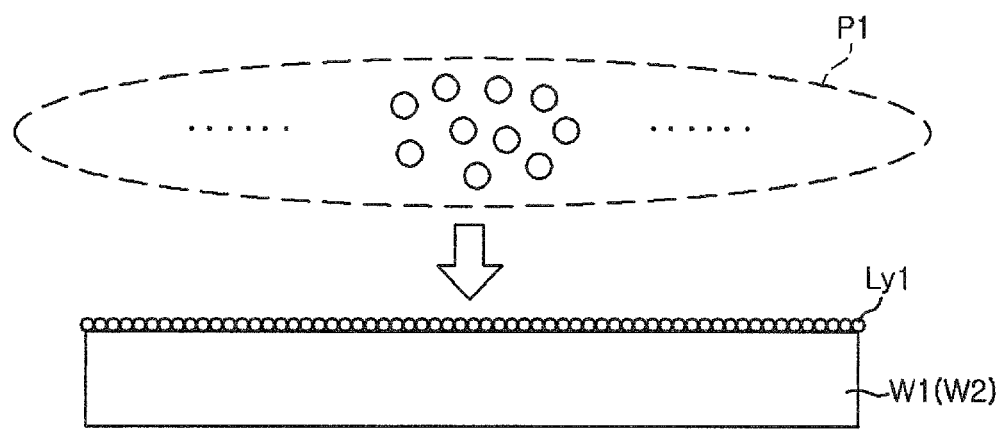
Figure 7C:
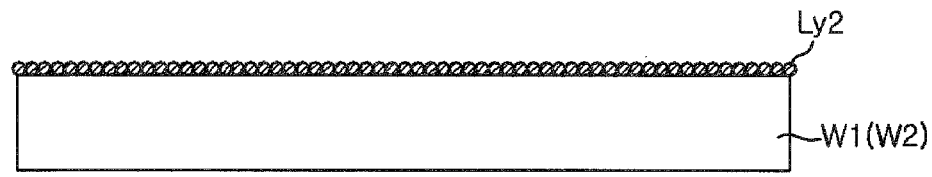
Figure 8:
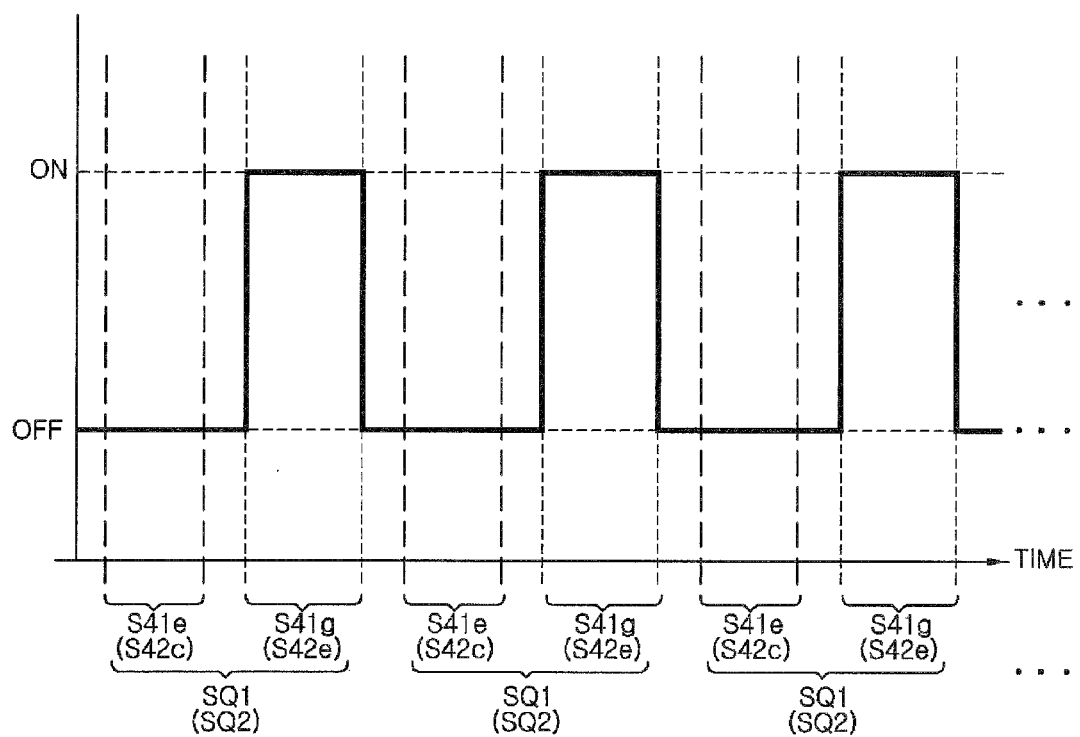
FIG. 8 is a timing chart of plasma generation in the protective film forming sequence shown in FIG. 4.

Next, one example of the step S4 of FIG. 1 will be described in detail with reference to FIG. 4. In the following description, FIGS. 5A to 8 will be referred to. FIGS. 6A to 6C are cross sectional views showing the states of the target object after the executions of corresponding steps shown in FIG. 4. FIGS. 7A to 7C schematically show formation of the protective film in the protective film forming sequence shown in FIG. 4. FIG. 8 is a timing chart of plasma generation in the protective film forming sequence shown in FIG. 4.

The step S4 executed after the steps S1 to S3 is shown in FIG. 4. First, in a step S41a, the wafer W1 shown in FIG. 5A is prepared as the wafer W shown in FIG. 2. The wafer W1 prepared in the step S41a includes a substrate SB1, an etching target layer EL1, an organic film OL1, an anti-reflection film AL1, and a mask MK11, as shown in FIG. 5A. The etching target layer EL1 is formed on the substrate SB1. The etching target layer EL1 is made of a material that is selectively etched with respect to the organic film OL1. As for the etching target layer EL1, an insulating film is used. The etching target layer EL1 is made of, e.g., silicon oxide ($SiO_2$). The etching target layer EL1 has a thickness LD. Further, the etching target layer EL1 may be made of another material such as polycrystalline silicon.

The organic film OL1 is formed on the etching target layer EL1. The organic film OL1 is a layer containing carbon, e.g., a SOH (spin on hard mask) layer. The anti-reflection film AL1 contains silicon and is formed on the organic film OL1.

The mask MK11 is formed on the anti-reflection film AL1. The mask MK11 is a resist mask made of a resist material. The mask MK11 is manufactured by patterning a resist layer by a photolithography technology. The mask MK11 covers a part of the anti-reflection film AL1. The mask MK11 has openings through which a part of the anti-reflection film AL1 is exposed. For example, the mask MK11 has a line and space pattern. Further, the mask MK11 may have a pattern that provides circular openings when seen from the top. Alternatively, the mask MK11 may have a pattern that provides oval openings when seen from the top.

In the step S41a, the wafer W1 shown in FIG. 5A is prepared. The wafer W1 is accommodated in the processing chamber 12 of the plasma processing apparatus 10 and mounted on the mounting table PD.

Upon completion of the step S41a, a step S41b is executed. In the step S41b, secondary electrons are irradiated onto the wafer W1. Specifically, hydrogen gas and rare gas are supplied into the processing chamber 12, and a plasma is generated by supplying a high frequency power from the first high frequency power supply 62. A negative DC voltage is applied to the upper electrode 30 by the power supply 70. Accordingly, positive ions in the processing space Sp are attracted to the upper electrode 30 and collide with the upper electrode 30. Due to the collision between the positive ions and the upper electrode 30, secondary electrons are sputtered from the upper electrode 30. The sputtered secondary electrons are irradiated onto the wafer W1, so that the mask MK11 is modified. When an absolute value of the negative DC voltage applied to the upper electrode 30 is high, silicon forming the electrode plate 34 is sputtered together with the secondary electrons by the collision between the positive ions and the electrode plate 34. The sputtered silicon is bonded with oxygen sputtered from the constituent components of the plasma processing apparatus 10 which are exposed to the plasma. The oxygen is sputtered from the members, e.g., the supporting part 14, the insulating shield member 32, and the deposition shield 46. The bonding between silicon and oxygen leads to the formation of a silicon oxide compound. The silicon oxide compound is deposited on the wafer W1 and, thus, the mask MK11 is protected. With the effect of modification and protection, the mask MK11 is protected from being damaged by subsequent steps. In the step S41b, the sputtering of silicon may be suppressed by minimizing the bias power of the second high frequency power supply 64 in order to realize the formation of the protective film and the modification of the mask by irradiation of secondary ions.

Next, in a step S41c, the anti-reflection film AL1 is etched. Specifically, a processing gas containing a fluorocarbon gas is supplied from a gas source selected among the gas sources of the gas source group 40 into the processing chamber 12. The high frequency power is supplied from the first high frequency power supply 62. The high frequency bias power is supplied from the second high frequency power supply 64. By operating the gas exhaust unit 50, a pressure in the space in the processing chamber 12 is set to a predetermined level. Accordingly, a plasma of the fluorocarbon gas is generated. A region of the anti-reflection film AL1 which is exposed through the mask MK11 is etched by active species containing fluorine in the generated plasma. As a result, a mask ALM1 is formed from the anti-reflection film AL1 as shown in FIG. 5B. A mask (first mask) for the organic film OL1 which is formed by the step S41c includes the mask MK11 and the mask ALM1.

Figure 5C:
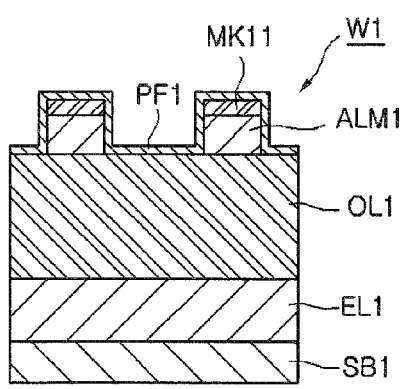

Next, in a step S41d, a protective film PF1 made of silicon oxide is formed on the surfaces of the masks MK11 and ALM1 and on the surface of the organic film OL1 in the same manner as that in the step S41b, as shown in FIG. 5C.

Upon completion of the step S41d, the sequence SQ1 is performed at least once in the step S4 shown in FIG. 4. The sequence SQ1 includes a step S41e (first step), a step S41f (second step), a step S41g (third step), and a step S41h (fourth step). In the step S41e, a first gas G1 containing silicon is introduced into the processing chamber 12. The first gas G1 is an aminosilane-based gas. The first gas G1 is supplied into the processing chamber 12 from a gas source selected among the gas sources of the gas source group 40. As for the first gas G1 that is the aminosilane-based gas, monoaminosilane ($H_3$—Si—R (R being an amino group)) gas is used. In the step S41e, a plasma of the first gas G1 is not generated.

As shown in FIG. 7A, molecules of the first gas 01 are adhered as a reaction precursor onto the surface of the wafer W1. The molecules (monoaminosilane) of the first gas G1 are adhered onto the surface of the wafer W by chemical adsorption based on chemical bonding, and a plasma is not used. In the step S41e, the temperature of the wafer W1 is equal to or higher than 0° C. and equal to or lower than a glass transition temperature (e.g., 200° C.) of the material forming the mask MK11. Other gas than monoaminosilane gas may be used as long as it contains silicon and can be adhered to the surface by chemical bonding at the above temperature range. Diaminosilane ($H_2$—Si—R2 (R being an amino group)) and triaminosilane (H—Si—R3 (R being an amino group)) have complex molecular structures compared to monoaminosilane. Therefore, when diaminosilane gas or triaminosilane gas is used as the first gas G1, heat treatment for self-decomposition of the amino group may be performed in order to realize uniform film formation.

The monoaminosilane-based gas is selected as the first gas G1 because chemical adsorption of monoaminosilane relatively easily occurs due to its relatively high electronegativity and molecular structure having polarity. A layer Ly1 formed by adhesion of molecules of the first gas G1 to the surface of the wafer W1 is close to a monolayer because the adhesion is chemical adsorption. As the amino group R of monoaminosilane becomes smaller, the molecular structure of the molecules adsorbed onto the surface of the wafer W1 becomes smaller and, thus, steric hindrance caused by the size of molecule is reduced. Accordingly, the molecules of the first gas G1 can be uniformly adsorbed onto the surface of the wafer W and the layer Ly1 can be formed with a uniform thickness on the surface of the wafer W1. For example, the reaction precursor of $H_3$—Si—O is formed by reaction between monoaminosilane ($H_3$—Si—R) contained in the first gas Gi and an OH group on the surface of the wafer W1, so that the layer Ly1 that is a monolayer of $H_3$—Si—O is formed. As a consequence, the layer Ly1 of the reaction precursor can be conformally formed on the surface of the wafer W1 with a uniform thickness without depending on the pattern density of the wafer W1.

In the step S41e, the layer Ly1 is formed not only on the surface of the wafer W1 but also on the surface of the protective film SXa1 exposed to the processing space Sp of the processing chamber 12 (including the inner surfaces of the various lines connected to the processing chamber 12). Further, the same layer (monolayer) as the layer Ly1 can be conformally formed with a uniform thickness by the first gas G1 regardless of the shape of the surface of the protective film SXa1.

Next, in the step S41f, the space in the processing chamber 12 is purged. Specifically, the first gas G1 supplied in the step S41e is exhausted. Alternatively, in the step S41f, an inert gas such as nitrogen gas may be supplied as a purge gas into the processing chamber 12. In other words, the purge in the step S41f may be performed by supplying an inert gas into the processing chamber 12 or by vacuum evacuation. In the step S41f, molecules excessively adhered onto the wafer W1 can be removed. As a result, the layer Ly1 of the reaction precursor becomes an extremely thin monolayer.

Next, in the step S41g, a plasma P1 of a second gas containing oxygen gas is generated in the processing chamber 12. In the step S41g, a temperature of the wafer W1 at the time of generation of the plasma P1 of the second gas is equal to or higher than 0° C. and equal to or lower than the glass transition temperature (e.g., 200° C.) of the material forming the mask MK11. Specifically, the second gas containing oxygen gas is supplied from a gas source selected among the gas sources of the gas source group 40 into the processing chamber 12. The high frequency power is supplied from the first high frequency power supply 62. In this case, the bias power of the second high frequency power supply 64 may be applied. Further, the plasma may be generated only by using the second high frequency power supply 64 without using the first high frequency power supply 62. By operating the gas exhaust unit 50, a pressure in the space in the processing chamber 12 is set to a predetermined level.

As described above, the molecules (molecules forming the layer Ly1 that is a monolayer) adhered onto the surface of the wafer W by the execution of the step S41e includes silicon-hydrogen bonds. The binding energy of silicon-hydrogen bond is lower than that of silicon-oxygen bond. Therefore, when the plasma P1 of the second gas containing oxygen gas is generated as shown in FIG. 7B, active species of oxygen, e.g., oxygen radicals are generated and hydrogen molecules forming the layer Ly1 that is a monolayer are substituted by oxygen molecules. As a result, a layer Ly2 that is a silicon oxide film is formed as a monolayer as shown in FIG. 7C.

Next, in the step S41h, the space in the processing chamber 12 is purged. Specifically, the second gas supplied in the step S41g is exhausted. Alternatively, in the step S41h, an inert gas such as nitrogen gas may be supplied as a purge gas into the processing chamber 12. In other words, the purge in the step S41h may be performed by supplying the inert gas into the processing chamber 12 or by vacuum evacuation.

In the above-described sequence SQ1, the purge is performed in the step S41f and, then, hydrogen molecules forming the layer Ly1 are substituted by oxygen molecules in the step S41g. Therefore, as in the case of employing the ALD method, by executing the sequence SQ1 once, the layer Ly2 that is a silicon oxide film can be conformally formed on the surface of the wafer W1 with a thin and uniform thickness regardless of the density of the mask MK11.

Upon completion of the sequence SQ1, the step S41i is executed. In the step S41i, it is determined whether or not the execution of the sequence SQ1 is completed. Specifically, in the step S41i, it is determined whether or not the number of execution of the sequence SQ1 has reached a predetermined number. By determining the number of execution of the sequence SQ1, the thickness of the protective film SX1 formed on the wafer W1 is determined. In other words, a final thickness of the protective film SX1 formed on the wafer W1 is substantially determined by multiplying the number of execution of the sequence SQ1 by the thickness of the silicon oxide film formed by executing the sequence SQ1 once. Therefore, the number of execution of the sequence SQ1 is set depending on a desired thickness of the protective film SX1 formed on the wafer W1.

Figure 5D:
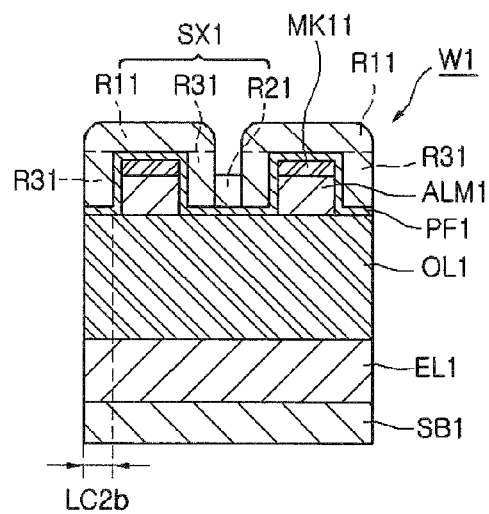

When it is determined in the step S41i that the number of execution of the sequence SQ1 does not reach the predetermined number (step S41i: NO), the execution of the sequence SQ1 is repeated. On the other hand, when it is determined in the step S41i that the number of execution of the sequence SQ1 reaches the predetermined number (step S41i: YES), the execution of the sequence SQ1 is completed. Accordingly, as shown in FIG. 5D, the protective film SX1 that is the silicon oxide film is formed on the surface of the wafer W1. In other words, by repeating the execution of the sequence SQ1 a predetermined number of times, the protective film SX1 having a predetermined thickness is conformally formed with a uniform thickness on the surface of the wafer W1 regardless of the density of the mask MK11.

The plasma generation timing in the sequence SQ1 is shown in FIG. 8. Referring to FIG. 8, the sequence SQ1 is repeated at least three times. In FIG. 8, "ON" indicates a state in which the plasma is generated and "OFF" indicates a state in which no plasma is generated. As shown in FIG. 8, in the sequence SQ1, the plasma is not generated in the step S41e and is generated only in the step S41g.

The protective film SX1 includes regions R11, R21 and R31 as shown in FIG. 5D. In FIG. 5D, the region R31 vertically extends along the side surface of the mask MK11 and the side surface of the mask ALM1. The region R31 extends from the surface of the organic film OL1 to a position under the region R11. The region R11 horizontally extends on the top surface of the mask MK11 and on the region R31. The region R21 vertically extends between the adjacent regions R31 and on the surface of the organic film OL1. As described above, in the sequence SQ1, the protective film SX1 is formed as in the case of employing the ALD method. Therefore, the regions R11, R21 and R31 have substantially the same thickness regardless of the density of the mask MK11.

Hereinafter, the formation of the protective film in the processing chamber 12 during the execution of the sequence SQ1 will be described. The protective film SX1 is formed on the surface of the wafer W1 and, also, the protective film SXa2 shown in the state A3 of FIG. 3 is formed on the surface of the protective film SXa1 in the processing space Sp by repeatedly executing the sequence SQ1. Therefore, a thickness LC2b of the protective film SX1 becomes substantially the same as the thickness LC2a of the protective film SXa2. In other words, by repeatedly executing the sequence SQ1 in the step S4 shown in FIG. 4, the protective film SXa2 having the same thickness as that of the protective film SX1 is conformally formed with a uniform thickness on the surface of the protective film SXa1.

The protective film SXa1 shown in the states A2 and A3 of FIG. 3 is formed in the step S2 by the same sequence as the sequence SQ1. Therefore, by repeatedly executing such sequence in the step S2 a predetermined number of times, the protective film SXa1 having the predetermined thickness LC1 is conformally formed with a uniform thickness on the surfaces of the constituent components of the plasma processing apparatus 10 which are exposed to the processing space Sp or the like.

Referring back to FIG. 4, upon completion of the step S41i, in the step S41j, the protective film SX1 is etched (etch back) such that the regions R11 and R21 are removed. In order to remove the regions R11 and R21, an anisotropic etching condition is required. Therefore, in the step S41j, a processing gas containing a fluorocarbon gas is supplied into the processing chamber 12 from a gas source selected among the gas sources of the gas source group 40. The high frequency power is supplied from the first high frequency power supply 62. The high frequency bias power is supplied from the second high frequency power supply 64. By operating the gas exhaust unit 50, a pressure in the space in the processing chamber 12 is set to a predetermined level. Accordingly, a plasma of the fluorocarbon gas is generated. Active species containing fluorine in the generated plasma are attracted in a vertical direction by the high frequency bias power, so that the regions R11 and R21 are preferentially etched. As a result, as shown in FIG. 6A, the regions R11 and R21 are selectively removed and a mask MS1 is formed by the remaining region R31. The mask MS1, the protective film PF1, and the mask ALM1 form a mask MK21 on the surface of the organic film OL1.

Next, in the step S41k, the organic film OL1 is etched. Specifically, a processing gas containing nitrogen gas and hydrogen gas is supplied into the processing chamber 12 from a gas source selected among the gas sources of the gas source grolup 40. The high frequency power is supplied from the high frequency power supply 62. The high frequency bias power is supplied from the second high frequency power supply 64. By operating the gas exhaust unit 50, a pressure in the space in the processing chamber 12 is set to a predetermined level. Accordingly, a plasma of the processing gas containing nitrogen gas and hydrogen gas is generated. A region of the organic film OL1 which is exposed through the mask MK21 is etched by hydrogen radicals that are active species of hydrogen in the generated plasma.

As a consequence, a mask OLM1 is formed from the organic film OL1 as shown in FIG. 6B. As for a gas for etching the organic film OL1, a processing gas containing oxygen may be used. A width of an opening provided by the mask OLM1 becomes substantially the same as that of the opening provided by the mask MK21.

Next, in a step S41m, the etching target layer EL1 is etched. Specifically, a processing gas is supplied into the processing chamber 12 from a gas source selected among the gas sources of the gas source group 40. The processing gas may be appropriately selected depending on a material forming the etching target layer EL1. For example, when the etching target layer EL1 is made of silicon oxide, the processing gas may contain a fluorocarbon gas. The high frequency power is supplied from the first high frequency power supply 62. The high frequency bias power is supplied from the second high frequency power supply 64. By operating the gas exhaust unit 50, a pressure in the space in the processing chamber 12 is set to a predetermined level. Accordingly, a plasma is generated. A region of the etching target layer EL1 which is exposed through the mask OLM1 is etched by active species in the generated plasma. As a result, as shown in FIG. 6C, the pattern of the mask OLM1 is transferred to the etching target layer EL1.

Hereinafter, a thickness of the protective film SXa formed in the processing chamber 12 will be described. A thickness (LC1+LC2a) of the protective film SXa formed in the processing chamber 12 before the execution of the step S41k of etching the organic film OL1 is greater than a thickness LE of the protective film SXa removed by etching until the completion of the step S41k of etching the organic film OL1, and satisfies a relationship LE<(LC1+LC2a). The thickness (LC1+LC2a) of the protective film SXa formed in the processing chamber 12 before the execution of the step S41k of etching the organic film OL1 is smaller than a thickness LD of the etching target layer EL1 and satisfies a relationship (LC1+LC2a)<LD. Thus, the thickness (LC1+LC2a) of the protective film SXa can satisfy both relationships, i.e., LE<LC1+LC2a<LD. Especially, when the relationship (LC1+LC2a)<LD is satisfied, the protective film SXa in the processing chamber 12 is completely removed until the completion of the step S41m. Therefore, it is not necessary to perform the process in the step S6.

By executing the step S4 shown in FIG. 4, the following effects can be obtained. In the step S41e, the first gas G1 containing the aminosilane-based gas is supplied into the processing chamber 12 without generating a plasma. Then, in the step S41g, a plasma 21 of the second gas containing oxygen gas is generated and the protective film SX1 that is a thin silicon oxide film is formed. With the steps S41e to S41h (sequence SQ1) performed in the step S4 shown in FIG. 4, the protective film SX1 is conformally and uniformly formed on the surface of the wafer W1. Further, the sequence SQ1 is repeatedly performed during the formation step (from the step S41e to the step S41i (YES)) performed in the step S4 shown in FIG. 4, so that the thickness of the protective film SX1 formed on the surface of the wafer W1 can be controlled with high accuracy. Due to the protective film SX1 formed by the formation step including multiple executions of the sequences SQ1, the critical dimension of the pattern on the surface of the wafer W1 can be reduced with high accuracy and the miniaturization accompanying the high integration can be realized.

Further, with the formation step (from the step S41e to the step S41i (YES)) performed in the step S4 shown in FIG. 4, the protective film SX1 that is a silicon oxide film is formed on the surface of the wafer W1 and, also, another protective film (protective film SXa2) that is a silicon oxide film is formed with the same thickness as that of the protective film SX1 on the inner surface of the processing chamber 12 and on the inner surfaces of the various lines connected to the processing chamber 12. Due to the protective film SXa2 formed on the inner surface of the processing chamber 12 and on the inner surfaces of the various lines connected to the processing chamber 12, the generation of particles from the surfaces and the changes in the states of the surfaces can be sufficiently suppressed. Accordingly, the stable reproduction of critical dimension or the like can be realized.

The formation step (from the step S41e to the step S41i (YES)) is performed not only in the step S4 shown in FIG. 4 but also in the preparation step S2 executed before the step S4 shown in FIG. 4. Therefore, a silicon oxide film having a desired thickness depending on the thickness of the silicon oxide film removed by the etching in the step S4 shown in FIG. 4 can be formed as the protective film on the inner surface of the processing chamber 12 and on the inner surfaces of the various lines connected to the processing chamber 12. Accordingly, the generation of particles from the surfaces and the changes in the surface states can be sufficiently suppressed without depending on the degree of etching performed in the step S4 shown in FIG. 4.

Since the formation step (from the step S41e to the step S41i (YES)) can be performed by using the first gas G1 containing monoaminosilane ($H_3$—Si—R (R being an amino group)), the protective films SX1 and SXa can be accurately and conformally formed with a uniform thickness with respect to the surface shape as in the case of employing the ALD method.

Further, in the case of using monoaminosilane, the wafer W1 can be processed at a relatively low temperature equal to or higher than 0° C. and equal to or lower than the glass transition temperature of the material forming the mask MK11. Thus, it is unnecessary to perform the process of heating the wafer W1.

Even when the silicon oxide film remains inside the processing chamber 12 and inside the various lines connected to the processing chamber 12 after the step S4 shown in FIG. 4, it is possible to completely remove the remaining silicon oxide film from the processing chamber 12 and from the various lines connected to the processing chamber 12 by executing the step S6.

The thickness (LC1+LC2a) of the protective film SXa formed in the processing chamber 12 before the execution of the step S41k of etching the organic film OL1 is greater than the thickness LE of the protective film SXa removed by etching until the completion of the step S41k of etching the organic film OL1. In this manner, the silicon film remains on the inner surface of the processing chamber 12 and on the inner surfaces of the various lines connected to the processing chamber 12 even after the completion of the etching of the organic film OL1 in the step S41k. Therefore, it is possible to avoid the changes in the surface states and the generation of particles from the surfaces in the subsequent steps which are otherwise caused by the removal of the silicon oxide film during the etching and the exposure of the surfaces. Further, since the formation step (from the step S41e to the step S41i (YES)) of forming the protective film SX1 is performed before the etching of the organic film OL1 in the step S41k, it is possible to prevent the active species (e.g., hydrogen radicals) generated by the etching of the organic film OL1 from reacting with the inner surface of the processing chamber 12 and the inner surfaces of the various lines connected to the processing chamber 12. Accordingly, the generation of particles from the surfaces and the changes in the surface states can be sufficiently suppressed.

The thickness (LC1+LC2a) of the protective film SXa formed in the processing chamber 12 before the execution of the step S41k of etching the organic film OL1 is smaller than the thickness LD of the etching target layer EL1. Since the thickness of the protective film SXa formed on the inner surface of the processing chamber 12 and on the inner surfaces of the various lines connected to the processing chamber 12 is smaller than the thickness of the etching target layer EL1, the protective film SXa formed on the inner surface of the processing chamber 12 and on the inner surfaces of various liens connected to the processing chamber 12 is removed by the etching of the etching target layer EL1. Therefore, it is unnecessary to perform, after the step S4, the process (step S6) of removing the silicon oxide film from the processing chamber 12 and from the various lines connected to the processing chamber 12 in the cleaning process of the processing chamber 12 and the various lines connected to the processing chamber 12.

Figure 11A:
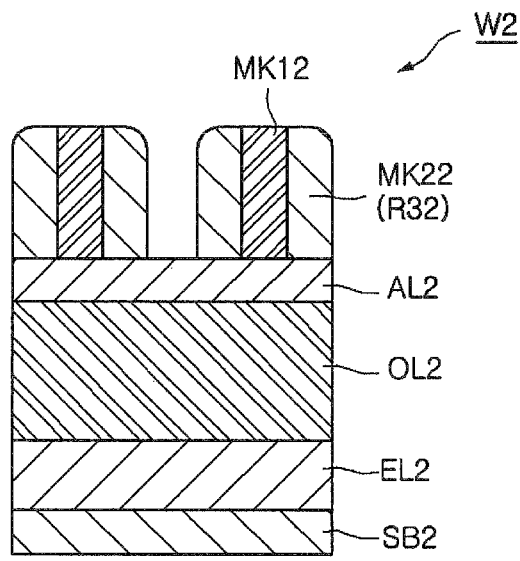
FIGS. 11A and 11B are cross sectional views showing the states of the target object after the execution of the corresponding steps shown in FIG. 9.
Figure 11B:
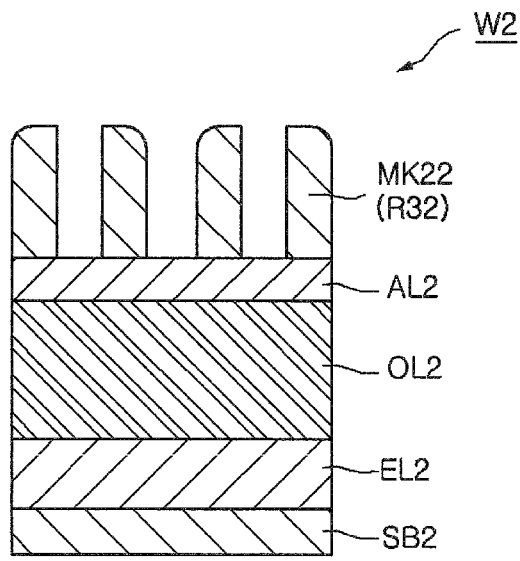
Figure 12A:
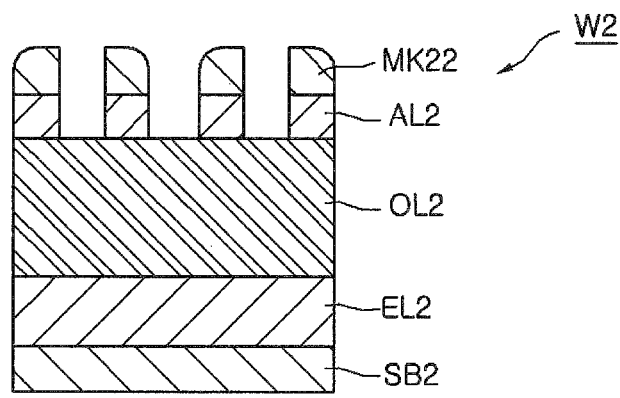
FIGS. 12A to 12C are cross sectional views showing the states of the target object after the execution of corresponding steps shown in FIG. 9.
Figure 12B:
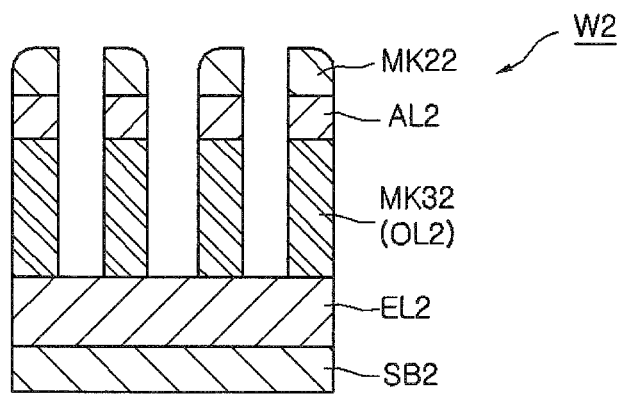
Figure 12C:
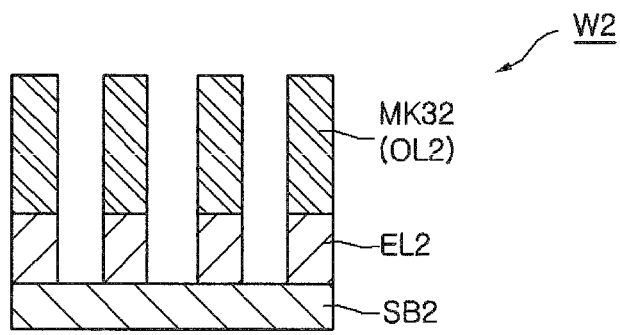

Hereinafter, another example of the step S4 shown in FIG. 1 will be described in detail with reference to FIG. 9. In the following description, FIGS. 10A to 12C will be referred to. FIGS. 11A and 12C are cross sectional views showing the states of the target object after the execution of corresponding steps shown in FIG. 9.

In the step S4 shown in FIG. 9, first, in a step S42a, the wafer W2 shown in FIG. 10A is prepared as the wafer W shown in FIG. 2. The wafer W2 prepared in the step S42a includes a substrate SB2, an etching target layer EL2, an organic film OL2, an anti-reflection film AL2, and a mask MK12 (first mask) as shown in FIG. 10A. The etching target layer EL2 is formed on the substrate SB2. The etching target layer EL2 is made of a material that is selectively etched with respect to the organic film OL2. The etching target layer EL2 may be made of, e.g., silicon oxide (SiO$_2$). Further, the etching target layer EL2 may be made of another material such as polycrystalline silicon. The organic film OL2 is formed on the etching target layer EL2. The organic film OL2 is a layer containing carbon, e.g., a SOH (spin on hard mask) layer. The anti-reflection film AL2 contains silicon and is formed on the organic film OL2.

The mask MK12 is formed on the anti-reflection film AL2. The mask MK12 is a resist mask made of a resist material. The mask MK12 is manufactured by patterning a resist layer by a photolithography technology. The mask MK12 covers a part of the anti-reflection film AL2. The mask MK12 has openings through which a part of the anti-reflection film AL2 is exposed. For example, the mask MK12 has a line and space pattern. Further, the mask MK12 may have a pattern that provides circular openings when seen from the top. Alternatively, the mask MK12 may have a pattern that provides oval openings when seen from the top.

In the step S42a, the wafer W2 shown in FIG. 10A is prepared. The wafer W2 is accommodated in the processing chamber 12 of the plasma processing apparatus 10 and mounted on the mounting table PD.

Upon completion of the step S42a, a step S42b is executed. The process in the step S42b is the same as that in the step S41b. Therefore, by performing the process in the step S42b, the mask MK12 is modified and silicon oxide is deposited on the wafer W2. Accordingly, a protective film of silicon oxide covers and protects the mask MK12.

Upon completion of the step S42b, the sequence SQ2 and a step S42g are executed. The step S42g is executed after the sequence SQ2. The sequence SQ2 includes a step S42c (first step), a step S42d (second step), a step S42e (third step), and a step S42f (fourth step). The steps S42c to S42f are the same as the steps S41e to S41h of the sequence SQ1 shown in FIG. 4. In other words, the sequence SQ2 is the same as the sequence SQ1 shown in FIG. 4. The step S42g is the same as the step S41i shown in FIG. 4. Therefore, when it is determined in the step S42g that the number of execution of the sequence SQ2 reaches a predetermined number (step S42g: YES), the execution of the sequence SQ2 is completed and the protective film SX2 that is the silicon oxide film is formed on the surface of the wafer W2 as shown in FIG. 10B. In other words, by repeating the sequence SQ2 a predetermined number of times, the protective film SX2 having a predetermined thickness is conformally formed with a uniform thickness on the surface of the wafer W regardless of the density of the mask MK12.

The protective film SX2 includes regions R12, R22 and R32 as shown in FIG. 10B. The region R32 vertically extends along the side surface of the mask MK12. The region R32 extends from the surface of the anti-reflection film AL2 to a position under the region R12. The region R12 horizontally extends on the top surface of the mask MK12 and on the region R32. The region R22 vertically extends between the adjacent regions R32 and on the surface of the anti-reflection film AL2. As described above, in the sequence SQ2, the protective film SX2 is formed as in the case of employing the ALD method. Therefore, the regions R12, R22 and R32 have substantially the same thickness regardless of the density of the mask MK12.

By forming the protective film SX2 on the surface of the wafer W2 and repeatedly executing the sequence SQ2, the protective film SXa2 shown in the state A3 of FIG. 3 is formed on the surface of the protective film SXa1 in the processing space Sp or the like. Therefore, a thickness LC2b of the protective film SX2 becomes substantially the same as the thickness LC2a of the protective film SXa2. In other words, by repeatedly executing the sequence SQ2 in the step S4 shown in FIG. 9, the protective film SXa2 having the same thickness as that of the protective film SX2 is conformally formed with a uniform thickness on the surface of the protective film SXa1 in the processing space Sp. In the steps S42c and S42e, the temperature of the wafer W2 is equal to or higher than 0° C. or equal to or lower than the glass transition temperature (e.g., about 200° C.) of the material forming the mask MK12.

The protective film SXa1 shown in the states A2 and A3 of FIG. 3 is formed in the step S2 by the same sequence as the sequence SQ2. Therefore, by repeatedly executing such sequence in the step S2 a predetermined number of times, the protective film SXa1 having the predetermined thickness LC1 is conformally formed with a uniform thickness on the surfaces of the constituent components of the plasma processing apparatus 10 which are exposed to the processing space SP or the like.

Referring back to FIG. 9, upon completion of the step S42g, in a step S42h, the protective film SX2 is etched (etch back) such that the regions R12 and R22 are removed. In order to remove the regions R12 and R22, an anisotropic etching condition is required. Therefore, in the step S42h, a processing gas containing a fluorocarbon gas is supplied into the processing chamber 12 from a gas source selected among the gas sources of the gas source group 40. The high frequency power is supplied from the first high frequency power supply 62. The high frequency bias power is supplied from the second high frequency power supply 64. By operating the gas exhaust unit 50, a pressure in the space in the processing chamber 12 is set to a predetermined level. Accordingly, a plasma of the fluorocarbon gas is generated. Active species containing fluorine in the generated plasma are attracted in a vertical direction by the high frequency bias power, so that the regions R12 and R22 are preferentially etched. As a result, as shown in FIG. 11A, the regions R12 and R22 are selectively removed and a mask MK22 (second mask) is formed by the remaining region R32.

Next, in a step S42i, the mask MK12 is removed. Specifically, a processing gas containing oxygen gas is supplied into the processing chamber 12 from a gas source selected among the gas sources of the gas source grolup 40. The high frequency power is supplied from the high frequency power supply 62. The high frequency bias power is supplied from the second high frequency power supply 64. By operating the gas exhaust unit 50, a pressure in the space in the processing chamber 12 is set to a predetermined level. Accordingly, a plasma of the processing gas containing oxygen gas is generated. The mask MK12 is etched by active species of oxygen in the generated plasma as shown in FIG. 11B. As a consequence, the mask MK12 is removed and the mask MK22 only remains on the anti-reflection film AL2.

Next, in a step S42j, the anti-reflection film AL2 is etched. Specifically, a processing gas containing a fluorocarbon gas is supplied into the processing chamber 12 from a gas source selected among the gas sources of the gas source group 40. The high frequency power is supplied from the first high frequency power supply 62. The high frequency bias power is supplied from the second high frequency power supply 64. By operating the gas exhaust unit 50, a pressure in the space in the processing chamber 12 is set to a predetermined level. Accordingly, a plasma of the fluorocarbon gas is generated. A region of the anti-reflection film AL2 which is exposed through the mask MK22 is etched as shown in FIG. 12a by active species containing fluorine in the generated plasma.

Next, in a step S42k, the organic film OL2 is etched. Specifically, a processing gas containing nitrogen gas and hydrogen gas is supplied into the processing chamber 12 from a gas source selected among the gas sources of the gas source grolup 40. The high frequency power is supplied from the high frequency power supply 62. The high frequency bias power is supplied from the second high frequency power supply 64. By operating the gas exhaust unit 50, a pressure in the space in the processing chamber 12 is set to a predetermined level. Accordingly, a plasma of the processing gas containing nitrogen gas and hydrogen gas is generated. A region of the organic film OL2 which is exposed through the mask MK22 is etched by hydrogen radicals that are active species of hydrogen in the generated plasma. As a consequence, a mask MK32 (third mask) is formed from the organic film OL2 as shown in FIG. 12B. Alternatively, as for a gas for etching the organic film OL2, a processing gas containing oxygen may be used.

Next, in a step S42m, the etching target layer EL2 is etched. Specifically, a processing gas is supplied into the processing chamber 12 from a gas source selected among the gas sources of the gas source group 40. The processing gas may be appropriately selected depending on a material forming the etching target layer EL2. For example, when the etching target layer EL2 is made of silicon oxide, the processing gas may contain a fluorocarbon gas. The high frequency power is supplied from the first high frequency power supply 62. The high frequency bias power is supplied from the second high frequency power supply 64. By operating the gas exhaust unit 50, a pressure in the space in the processing chamber 12 is set to a predetermined level. Accordingly, a plasma is generated. A region of the etching target layer EL2 which is exposed through the mask MK32 is etched by active species in the generated plasma. As a result, as shown in FIG. 12C, the pattern of the mask MK32 is transferred to the etching target layer EL2.

Hereinafter, the thickness of the protective film SXa formed in the processing chamber 12 will be described. The thickness (LC1+LC2a) of the protective film SXa formed in the processing chamber 12 before the execution of the step S42k of etching the organic film OL2 is greater than a thickness LE of the protective film SXa removed by etching until the completion of the step S42k of etching the organic film OL1, and satisfies the relationship LE<(LC1+LC2a). The thickness (LC1+LC2a) of the protective film SXa formed in the processing chamber 12 before the execution of the step S42k of etching the organic film OL1 is smaller than a thickness LD of the etching target layer EL2 and satisfies the relationship (LC1+LC2a)<LD. Thus, the thickness (LC1+LC2a) of the protective film SXa can satisfy both relationships, i.e., LE<(LC1+LC2a)<LD. Especially, when the relationship (LC1+LC2a)<LD is satisfied, the protective film SXa in the processing chamber 12 is completely removed until the completion of the step S42m. Therefore, it is unnecessary to perform the process in the step S6.

By executing the step S4 shown in FIG. 9, the following effects can be obtained. In the step S42c, the first gas G1 containing the aminosilane-based gas is supplied into the processing chamber 12 without generating a plasma. Then, in the step S42e, a plasma P1 of the second gas containing oxygen gas is generated and the protective film SX2 that is a thin silicon oxide film is formed. Accordingly, the protective film SX2 is conformally and uniformly formed on the surface of the wafer W2 by the steps S42c to S42f (sequence SQ2) performed in the step S4 shown in FIG. 9. Further, the sequence SQ2 is repeatedly performed during the formation step (from the step S42c to the step S42g (YES)) performed in the step S4 shown in FIG. 9, so that the thickness of the protective film SX2 formed on the surface of the wafer W2 can be controlled with high accuracy. Due to the protective film SX2 formed by the formation step including multiple execution of the sequence SQ2, the critical dimension of the pattern on the surface of the wafer W2 can be reduced with high accuracy, and the miniaturization accompanying the high integration can be realized.

Further, with the formation step (from the step S42c to the step S42g (YES)) performed in the step S4 shown in FIG. 9, the protective film SX2 that is a silicon oxide film is formed on the surface of the wafer W2 and, also, a silicon oxide film is formed as a protective film (protective film SXa2) with the same thickness as that of the protective film SX2 on the inner surface of the processing chamber 12 and on the inner surfaces of the various lines connected to the processing chamber 12. Due to the protective film SXa2 formed on the inner surface of the processing chamber 12 and on the inner surfaces of the various lines connected to the processing chamber 12, the generation of particles from the surfaces and the changes in the surface states can be sufficiently suppressed. Accordingly, the stable reproduction of the critical dimension or the like can be realized.

The formation step (from the step S42c to the step S42g (YES)) is performed not only in the step S4 shown in FIG. 9 but also in the preparation step S2 executed before the step S4 shown in FIG. 9. Therefore, a silicon oxide film having a desired thickness depending on the thickness of the silicon oxide film removed by the etching in the step S4 shown in FIG. 9 can be formed as the protective film on the inner surface of the processing chamber 12 and on the inner surfaces of the various lines connected to the processing chamber 12. Accordingly, the generation of particles from the surfaces and the changes in the surface states can be sufficiently suppressed without depending on the degree of etching performed in the step S4 shown in FIG. 9.

Since the formation step (from the step S42c to the step S42g (YES)) can be performed by using the first gas G1 containing monoaminosilane ($H_3$—Si—R (R being an amino group)), the protective films SX2 and SXa can be formed accurately and conformally with a uniform thickness with respect to the surface shape as in the case of employing the ALD method.

Further, in the case of using monoaminosilane, the wafer W2 can be processed at a relatively low temperature equal to or higher than 0° C. and equal to or lower than the glass transition temperature of the material forming the mask MK12. Thus, it is unnecessary to perform the process of heating the wafer W2.

Even when the silicon oxide film remains inside the processing chamber 12 and inside the various lines connected to the processing chamber 12 after the step S4 shown in FIG. 9, it is possible to completely remove the remaining silicon oxide film from the processing chamber 12 and from the various lines connected to the processing chamber 12 by executing the step S6.

The thickness (LC1+LC2a) of the protective film SXa formed in the processing chamber 12 before the execution of the step S42k of etching the organic film OL2 is greater than the thickness LE of the protective film SXa removed by etching until the completion of the step S42k of etching the organic film OL2. In this manner, the silicon film remains on the inner surface of the processing chamber 12 and on the inner surfaces of the various lines connected to the processing chamber 12 even after the completion of the etching of the organic film OL2 in the step S42k. Therefore, it is possible to avoid the changes in the surface states and the generation of particles from the surfaces in the subsequent steps which are otherwise caused by the removal of the silicon oxide film during the etching and the exposure of the surfaces. Further, since the formation step (from the step S42c to the step S42g (YES)) of forming the protective film SX2 is performed before the etching of the organic film OL2 in the step S42k, it is possible to prevent the active species (e.g., hydrogen radicals) generated by the etching of the organic film OL2 from reacting with the inner surface of the processing chamber 12 and the inner surfaces of the various lines connected to the processing chamber 12. Accordingly, the generation of particles from the surfaces and the changes in the surface states can be sufficiently suppressed.

The thickness (LC1+LC2a) of the protective film SXa formed in the processing chamber 12 before the execution of the step S42k of etching the organic film OL2 is smaller than the thickness LD of the etching target layer EL2. Since the thickness of the protective film SXa formed on the inner surface of the processing chamber 12 and on the inner surfaces of the various lines connected to the processing chamber 12 is smaller than the thickness of the etching target layer EL2, the protective film SXa formed on the inner surface of the processing chamber 12 and on the inner surfaces of various liens connected to the processing chamber 12 is removed by the etching of the etching target layer EL2. Therefore, the process (step S6) of removing the silicon oxide film in the processing chamber 12 and in the various lines connected to the processing chamber 12 in the cleaning process of the processing chamber 12 and the various lines connected to the processing chamber 12 which is performed after the step S4 becomes unnecessary.

While the disclosure has been shown and described with respect to the embodiments, it will be understood by those skilled in the art that various changes and modifications may be made without departing from the scope of the disclosure as defined in the following claims.

What is claimed is:

1. A method for processing a target object, comprising:
a formation step of forming a silicon oxide film in a processing chamber of a plasma processing apparatus by repeatedly executing a sequence including a first step of supplying a first gas containing aminosilane-based gas into the processing chamber, a second step of purging a space in the processing chamber after the execution of the first step, a third step of generating a plasma of a second gas containing oxygen gas in the processing chamber after the execution of the second step, and a fourth step of purging the space in the processing chamber after the execution of the third step;
a preparation step which is executed before the target object is accommodated in the processing chamber; and
a processing step of performing an etching process on the target object accommodated in the processing chamber,
wherein the preparation step is performed before the processing step,
the formation step is performed in the preparation step and the processing step, and
in the first step, a plasma of the first gas is not generated.

2. The method of claim 1, wherein the first gas contains monoaminosilane.

3. The method of claim 1, wherein the aminosilane-based gas contained in the first gas contains aminosilane having one to three silicon atoms.

4. The method of claim 1, wherein the aminosilane-based gas contained in the first gas contains aminosilane having one to three amino groups.

5. The method of claim 1, further comprising, after the processing step, a removing step of removing the silicon oxide film in the processing chamber after the target object is unloaded from the processing chamber.

6. The method of claim 1, wherein the target object includes an etching target layer and an organic film formed on the etching target layer,
the processing step includes an etching step of etching the organic film by a plasma generated in the processing chamber,
the formation step is executed before the etching step in the processing step, and
a thickness of the silicon oxide film formed in the processing chamber before the execution of the etching step is greater than a thickness of the silicon oxide film removed by etching until completion of the etching step.

7. The method of claim 6, wherein the thickness of the silicon oxide film formed in the processing chamber before the execution of the etching step is smaller than a thickness of the etching target layer.

8. The method of claim 1, wherein the target object includes an etching target layer and an organic film formed on the etching target layer,
   the processing step includes an etching step of etching the organic film by a plasma generated in the processing chamber,
   the formation step is executed before the etching step in the processing step,
   the organic film has thereon a first mask,
   the processing step further includes another etching step of etching an anti-reflection film having thereon a resist mask by a plasma generated in the processing chamber to form the first mask from the anti-reflection film,
   the etching step of etching the organic film is executed after the another etching step of etching the ant-reflection film,
   in the processing step, the formation step is executed between the another etching step and the etching step, and
   the processing step further includes, between the formation step and the etching step, a removing step of removing a portion of the silicon oxide film formed on a surface of the organic film in the formation step by a plasma generated in the processing chamber.

9. The method of claim 1, wherein the target object includes an etching target layer, an organic film formed on the etching target layer, and an anti-reflection film formed on the organic film,
   the processing step includes an etching step of etching the organic film by a plasma generated in the processing chamber,
   the formation step is executed before the etching step in the processing step,
   the anti-reflection film has thereon a first mask,
   the processing step includes:
   a removing step of removing, after the silicon oxide film is formed on the first mask and the anti-reflection film by the formation step, a portion of the silicon oxide film on a surface of the anti-reflection film and a top surface of the first mask by a plasma generated in the processing chamber to form a second mask including a portion of the silicon oxide film remaining on a side surface of the first mask;
   another removing step of removing the first mask by a plasma generated in the processing chamber; and
   another etching step of etching the anti-reflection film by a plasma generated in the processing chamber,
   the etching step of etching the organic film is executed after the another etching step of etching the anti-reflection film to form a third mask from the organic film.

10. The method of claim 8, wherein when the formation step is executed in the processing step, a temperature of the target object in the first step is equal to or higher than 0° C. and equal to or lower than a glass transition temperature of a material forming the first mask.

11. The method of claim 9, wherein when the formation step is executed in the processing step, a temperature of the target object in the first step is equal to or higher than 0° C. and equal to or lower than a glass transition temperature of a material forming the first mask.

* * * * *